United States Patent
Chen et al.

(10) Patent No.: US 9,502,272 B2
(45) Date of Patent: Nov. 22, 2016

(54) DEVICES AND METHODS OF PACKAGING SEMICONDUCTOR DEVICES

(71) Applicant: Taiwan Semiconductor Manufacturing Company, Ltd., Hsin-Chu (TW)

(72) Inventors: Jie Chen, New Taipei (TW); Hsien-Wei Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/584,741

(22) Filed: Dec. 29, 2014

(65) Prior Publication Data
US 2016/0190098 A1 Jun. 30, 2016

(51) Int. Cl.
*H01L 21/56* (2006.01)
*H01L 23/31* (2006.01)
(Continued)

(52) U.S. Cl.
CPC ........... *H01L 21/561* (2013.01); *H01L 21/563* (2013.01); *H01L 21/6835* (2013.01); *H01L 21/78* (2013.01); *H01L 23/3128* (2013.01); *H01L 23/3142* (2013.01); *H01L 24/19* (2013.01); *H01L 24/20* (2013.01); *H01L 25/105* (2013.01); *H01L 25/50* (2013.01); *H01L 2221/68327* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1041* (2013.01);
(Continued)

(58) Field of Classification Search
CPC ............. H01L 25/043; H01L 23/4012; H01L 25/0657; H01L 25/074; H01L 25/0756; H01L 25/117; H01L 2224/25174; H01L 2224/49174; H01L 2225/06503; H01L 2225/06513; H01L 2225/06517; H01L 2225/0652; H01L 21/78–21/8221; H01L 24/97; H01L 438/113–438/114; H01L 21/561; H01L 21/563; H01L 24/20; H01L 24/19; H01L 25/105; H01L 25/50; H05K 1/144
See application file for complete search history.

(56) References Cited

U.S. PATENT DOCUMENTS 7,564,115 B2   7/2009   Chen et al.
7,633,165 B2  12/2009   Hsu et al.
(Continued)

OTHER PUBLICATIONS

GPD Global Process, "Capillary Underfill-Successful Application Method," www.gpd-global.com; Rev. Feb. 2008; 4 pages.
(Continued)

*Primary Examiner* — Jose R Diaz
(74) *Attorney, Agent, or Firm* — Slater Matsil, LLP

(57) ABSTRACT

Devices and methods of packaging semiconductor devices are disclosed. In some embodiments, a device includes a first semiconductor device and a second semiconductor device coupled to the first semiconductor device. An underfill material is disposed between the first semiconductor device and the second semiconductor device. The underfill material is also disposed on sidewalls of the first semiconductor device and the second semiconductor device. The underfill material has a first thickness on sidewalls of the first semiconductor device and a second thickness on sidewalls of the second semiconductor device. The second thickness is different than the first thickness.

20 Claims, 11 Drawing Sheets

(51) Int. Cl.
    *H01L 21/78*     (2006.01)
    *H01L 21/683*     (2006.01)
    *H01L 25/00*     (2006.01)
    *H01L 23/00*     (2006.01)
    *H01L 25/10*     (2006.01)

(52) U.S. Cl.
    CPC .............. *H01L 2225/1058* (2013.01); *H01L 2924/15311* (2013.01); *H01L 2924/1811* (2013.01); *H01L 2924/1815* (2013.01)

(56) References Cited

U.S. PATENT DOCUMENTS

| | | | |
|---|---|---|---|
| 7,825,024 B2 | 11/2010 | Lin et al. | |
| 7,838,424 B2 | 11/2010 | Karta et al. | |
| 7,863,742 B2 | 1/2011 | Yu et al. | |
| 7,932,601 B2 | 4/2011 | Chang et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,557,684 B2 | 10/2013 | Wu et al. | |
| 8,669,174 B2 | 3/2014 | Wu et al. | |
| 8,749,077 B2 | 6/2014 | Wu et al. | |
| 8,754,508 B2 | 6/2014 | Chen et al. | |
| 8,772,151 B2 | 7/2014 | Chen | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,846,548 B2 | 9/2014 | Tu et al. | |
| 9,093,457 B2 * | 7/2015 | Gong | H01L 23/3128 257/669 |
| 2013/0341800 A1 | 12/2013 | Tu et al. | |
| 2014/0001645 A1 | 1/2014 | Lin et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0225258 A1 | 8/2014 | Chiu et al. | |
| 2014/0252558 A1 | 9/2014 | Yu et al. | |
| 2014/0252572 A1 | 9/2014 | Hou et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |

OTHER PUBLICATIONS

Wikipedia, "Surface Metrology," http://en.wikipedia.org/wiki/Surface_metrology, retrieved Nov. 20, 2014, pp. 1-7.

* cited by examiner

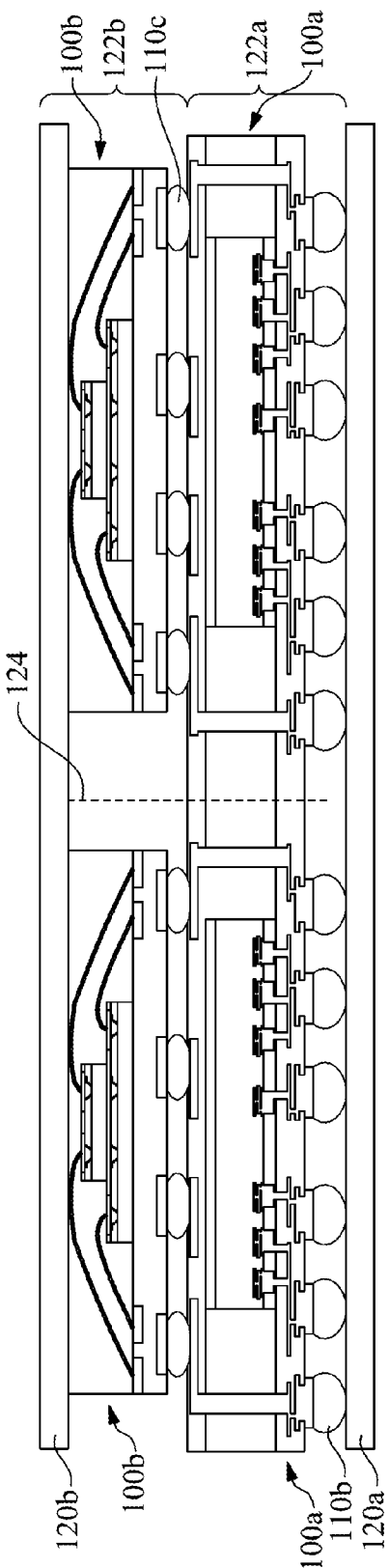
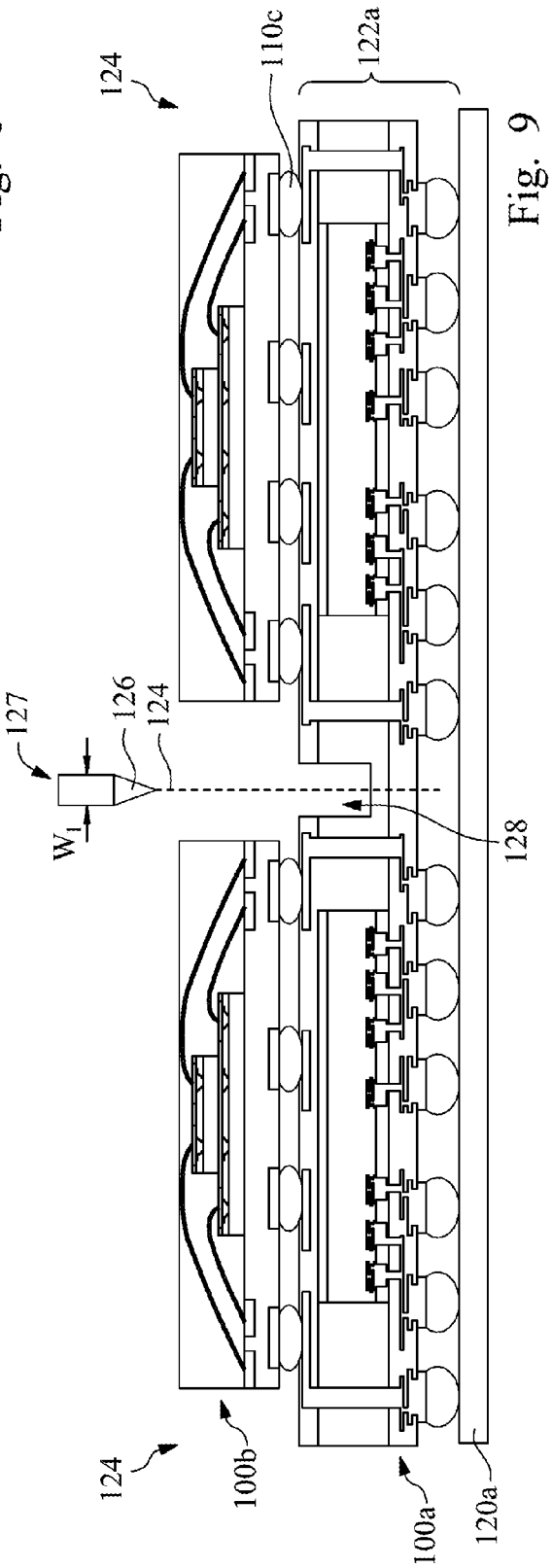

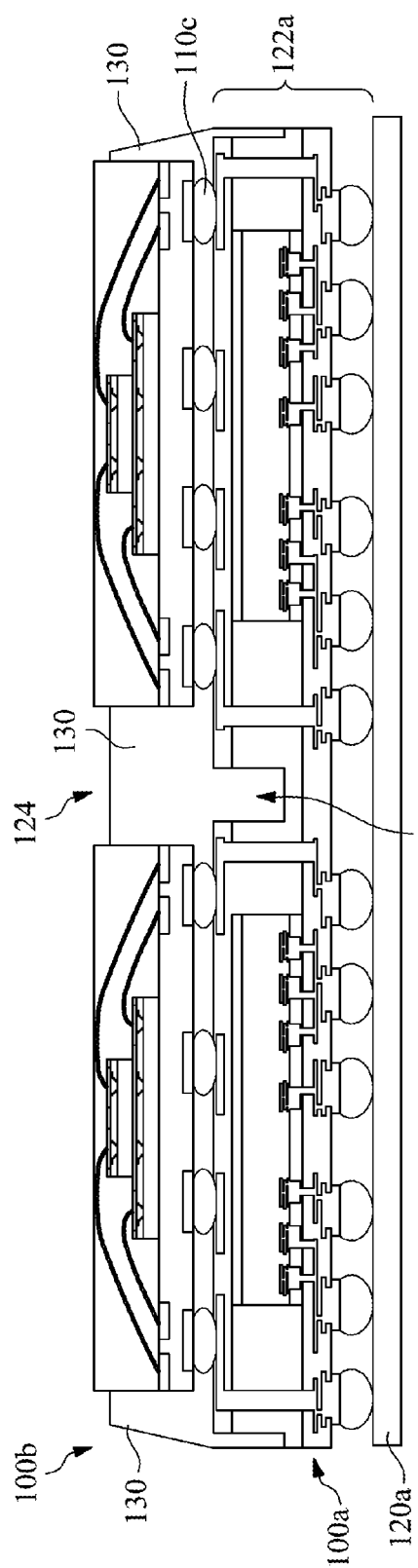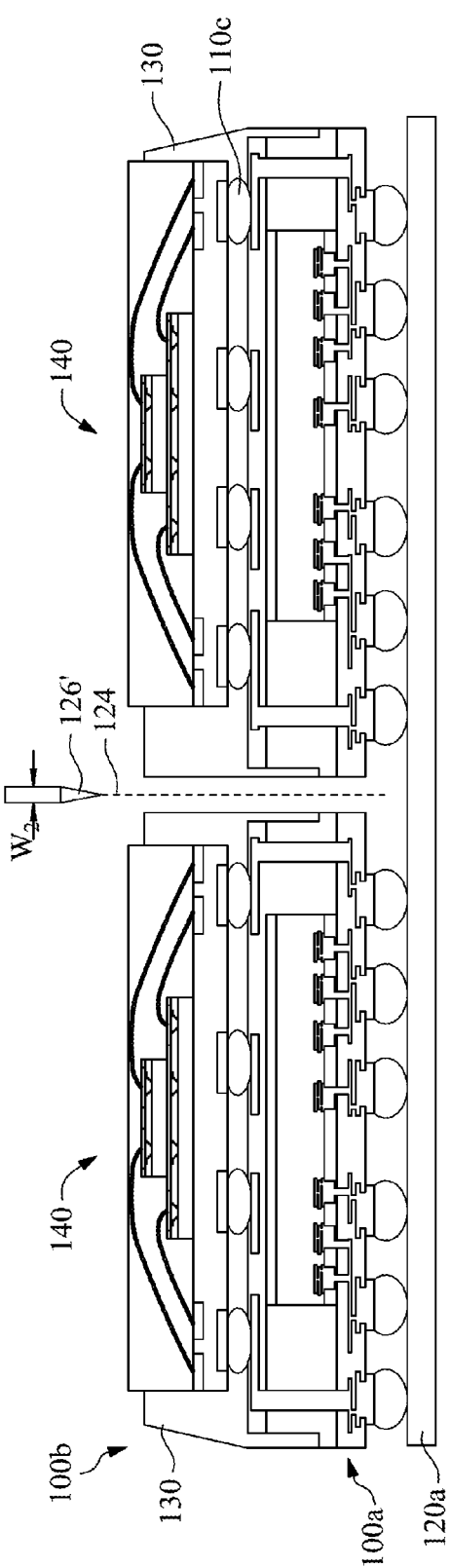

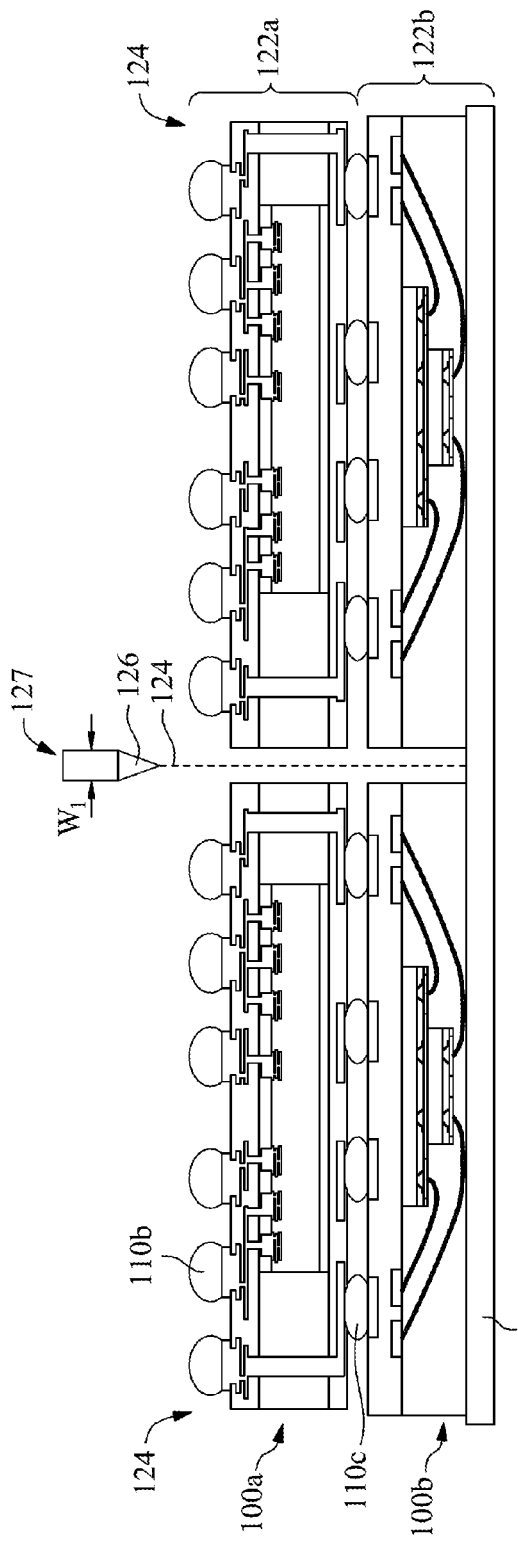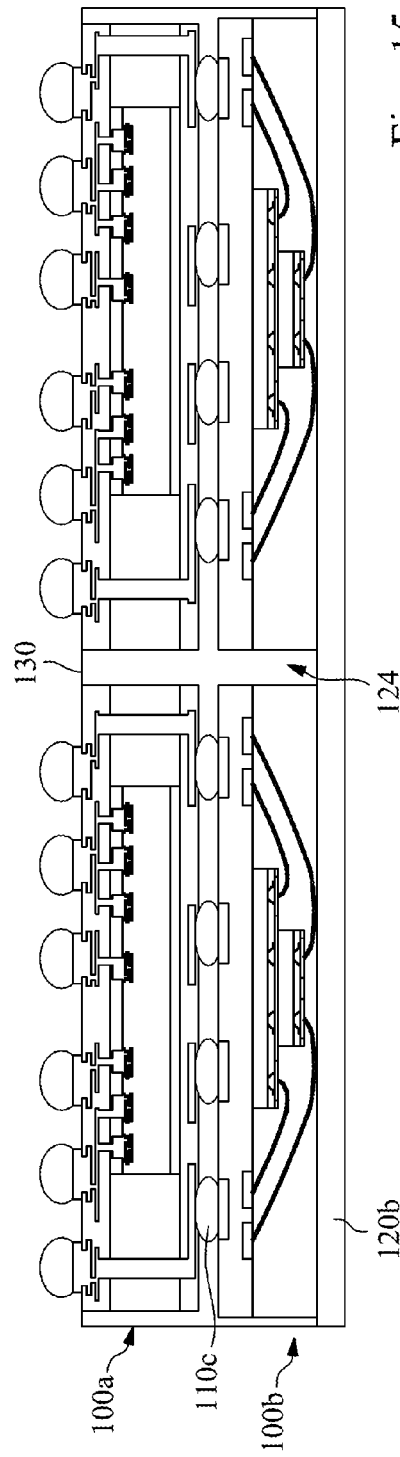
Fig. 14
Fig. 15

DEVICES AND METHODS OF PACKAGING SEMICONDUCTOR DEVICES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., 3D integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (PoP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 through FIG. 13 illustrate cross-sectional views of a method of packaging semiconductor devices at various stages in accordance with some embodiments.

FIG. 14 through FIG. 18 illustrate cross-sectional views of a method of packaging semiconductor devices at various stages in accordance with some embodiments of the present disclosure.

DETAILED DESCRIPTION

Figure 1:
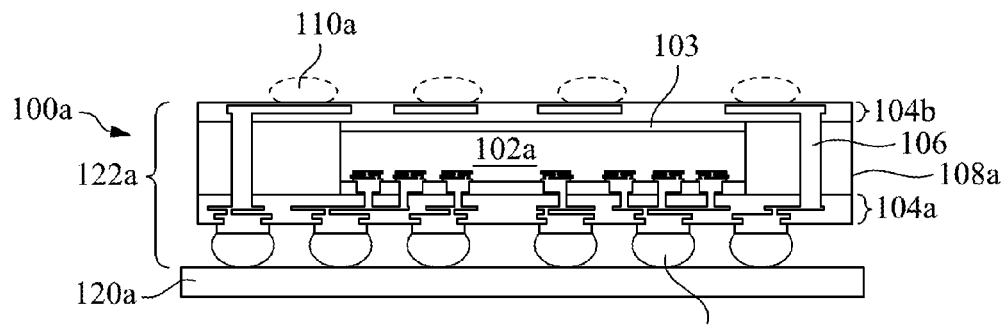
FIG. 1 through FIG. 3, FIG. 6 and FIG. 7 show cross-sectional views of a method of packaging semiconductor devices at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Devices and methods of packaging semiconductor devices are disclosed in the present disclosure. Two semiconductor devices are coupled together and are partially singulated. An underfill material is disposed between the two semiconductor devices and along scribe lines. The two semiconductor devices are then fully singulated. The underfill material is left remaining on sidewalls of at least one of the semiconductor devices. The underfill material prevents or reduces chipping during the full singulation process and also prevents a saw blade from damaging the semiconductor devices during the full singulation process.

Figure 4:
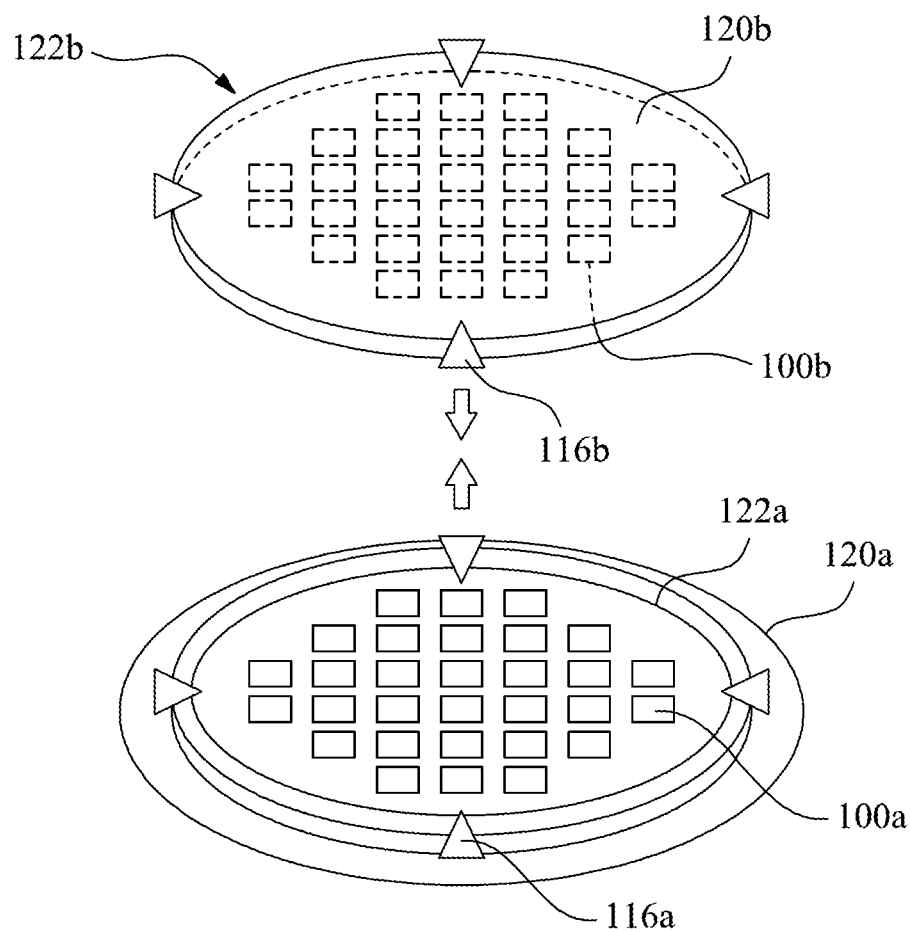
FIG. 4 and FIG. 5 are perspective views of the semiconductor devices shown in FIG. 3 and FIG. 6, respectively, in accordance with some embodiments.
Figure 5:
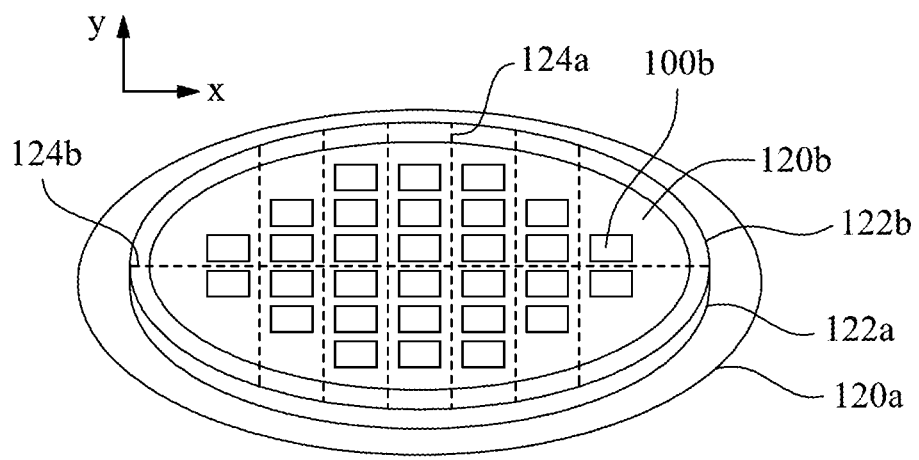
Figure 6:
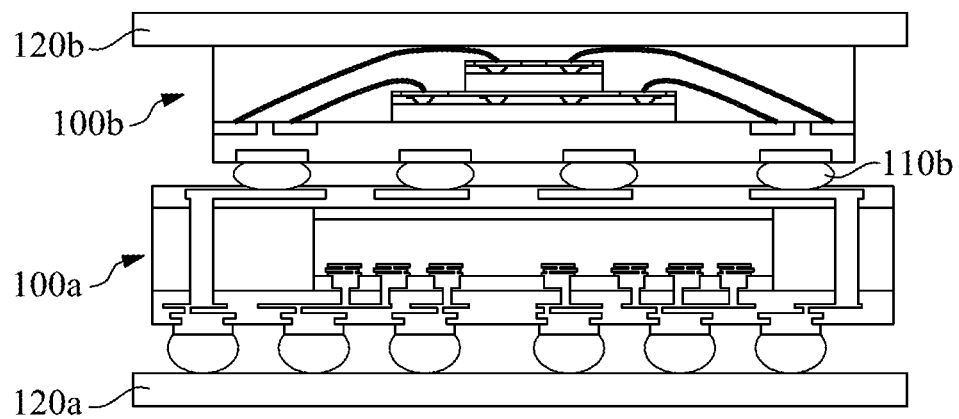

FIG. 1 through FIG. 3, FIG. 6 and FIG. 7 show cross-sectional views of a method of packaging semiconductor devices 100a and 100b at various stages in accordance with some embodiments of the present disclosure. FIG. 4 and FIG. 5 are perspective views of the semiconductor devices shown in FIG. 3 and FIG. 6, respectively.

Referring first to FIG. 1, a wafer 122a is provided that includes a plurality of semiconductor devices 100a formed thereon. The wafer 122a is also referred to herein as a first wafer 122a, for example. The semiconductor devices 100a comprise fan-out structures in some embodiments. The semiconductor devices 100a are also referred to herein, e.g., in the detailed description and in some of the claims, as first semiconductor devices 100a or fan-out structures 100a. The plurality of first semiconductor devices 100a is in wafer form and is unsingulated. Only one first semiconductor device 100a is shown in FIG. 1; however, dozens, hundreds, or more first semiconductor devices 100a may be formed on the first wafer 122a in an array of rows and columns (see FIG. 4).

Each of the first semiconductor devices 100a comprises an integrated circuit die 102a or a plurality of integrated circuit dies 102a. The integrated circuit dies 102a of the first semiconductor devices 100a are also referred to herein as first integrated circuit dies 102a.

The plurality of first semiconductor devices 100a includes an interconnect structure 104a that comprises a first redistribution layer (RDL) in some embodiments. The interconnect structure 104a may also comprise other types of interconnect structures, such as a post passivation interconnect (PPI) structure, as an example. The first RDL 104a comprises one or more insulating material layers and a plurality of conductive features formed in the insulating material layers, to be described further herein with reference to FIG. 12.

Referring again to FIG. 1, the plurality of first integrated circuit dies 102a of the first wafer 122a is coupled to the first RDL 104a. The plurality of first integrated circuit dies 102a may be coupled to contact pads or other conductive features of the first RDL 104a, for example. The plurality of first integrated circuit dies 102a is electrically coupled to portions of the first RDL 104a, for example.

A plurality of through-vias 106 is also coupled to portions of the first RDL 104a in some embodiments. The plurality of through-vias 106 provides vertical electrical connections for the plurality of first semiconductor devices 100a, for example. In other embodiments, the plurality of through-vias 106 is not included.

A molding material 108a is disposed around the plurality of first integrated circuit dies 102a and around the plurality of through-vias 106, over the first RDL 104a. The molding material 108a comprises a molding compound comprised of an insulating material, such as an epoxy, a filler material, a stress release agent (SRA), an adhesion promoter, other materials, or combinations thereof, as examples.

An interconnect structure 104b is disposed over the molding material 108a, the plurality of first integrated circuit dies 102a, and the plurality of through-vias 106. The interconnect structure 104b comprises one or more conductive feature layers and one or more insulating material layers, as described for the first RDL 104a. The interconnect structure 104b comprises a second RDL 104b in some embodiments. The first RDL 104a and the second RDL 104b provide horizontal electrical connections for the plurality of first semiconductor devices 100a in some embodiments, for example.

The first semiconductor devices 100a comprise a plurality of fan-out structures that include the first integrated circuit dies 102a, the through-vias 106, the molding material 108a, the RDLs 104a and 104b, and connectors 110b coupled to the first RDLs 104a in some embodiments, for example. Each of the first semiconductor devices 100a may comprise one or more first integrated circuit dies 102a in some embodiments, for example.

An example of a process flow for forming the first wafer 122a that includes the plurality of first semiconductor devices 100a will next be described. The plurality of first semiconductor devices 100a may be formed by providing a carrier (not shown), and forming the first RDL 104a over the carrier. The plurality of through-vias 106 may be formed over the first RDL 104a by plating, photolithography, or other methods, before or after the plurality of first integrated circuit dies 102a are coupled to the first RDL 104a. In some embodiments, the plurality of through-vias 106 is plated over the first RDL 104a, and the plurality of first integrated circuit dies 102a is attached to the first RDL 104a. The molding material 108a is then deposited over the plurality of through-vias 106, the plurality of first integrated circuit dies 102a, and exposed portions of the top surface of the first RDL 104a. As deposited, the molding material 108a may extend over top surfaces of the plurality of first integrated circuit dies 102a and the plurality of through-vias 106. A chemical-mechanical polishing (CMP) process, a grinding process, an etch process, other methods, or a combination thereof is used to remove the molding material 108a from over top surfaces of the plurality of first integrated circuit dies 102a and the plurality of through-vias 106. A top portion of the plurality of through-vias 106 may also be removed in some embodiments, reducing their height or thickness. The second RDL 104b is then formed over the molding material 108a, the plurality of through-vias 106, and the plurality of first integrated circuit dies 102a.

In another example of a process flow for forming the first wafer 122a that includes the plurality of first semiconductor devices 100a, a carrier (not shown) may be provided, and the second RDL 104b is formed over the carrier. The plurality of through-vias 106 may be formed over the second RDL 104b by plating, photolithography, or other methods, before or after the plurality of first integrated circuit dies 102a is coupled to the second RDL 104b. In some embodiments, the plurality of through-vias 106 is plated over the second RDL 104b, and then the plurality of first integrated circuit dies 102a is attached to the second RDL 104b. The molding material 108a is then deposited over the plurality of through-vias 106, the plurality of first integrated circuit dies 102a, and exposed portions of the top surface of the second RDL 104b. Any excess portions of molding material 108a that extend over top surfaces of the plurality of first integrated circuit dies 102a and the plurality of through-vias 106 is removed using a CMP process, a grinding process, an etch process, other methods, or a combination thereof. The first RDL 104a is then formed over the molding material 108a, the plurality of through-vias 106, and the plurality of first integrated circuit dies 102a.

The process flow for forming the first wafer 122a that includes the first semiconductor devices 100a may also comprise other processing steps and orders of the processing steps. One or more carriers may be used to form the plurality of first semiconductor devices 100a. At some point in the packaging process flow, openings are formed in an upper insulating material layer of the second RDL 104b to expose contact pads of the second RDL 104b. In some embodiments, a plurality of connectors 110a, shown in phantom in FIG. 1 (e.g., in dashed lines), is formed in the openings over the contact pads of the second RDL 104b. A connector 110a is coupled to each of the exposed contact pads of the second RDL 104b in some embodiments, for example. A plurality of connectors 110b is also coupled to contact pads of the first RDL 104a. The plurality of connectors 110b may be arranged in a ball grid array (BGA) in some embodiments, for example. The material of the plurality of connectors 110a and 110b comprises a eutectic material such as solder that is adapted to melt at a predetermined temperature, for example. The connectors 110a and 110b may comprise solder balls or solder bumps, as examples. When the eutectic material cools, the plurality of connectors 110a and 110b can be used to electrically and mechanically couple the plurality of first semiconductor devices 100a to another device or object.

The wafer 122a that includes the plurality of first semiconductor devices 100a is coupled to a first carrier 120a, also shown in FIG. 1. In some embodiments, the first carrier 120a comprises a carrier tape. The carrier tape 120a may be coupled to a support, not shown. The plurality of connectors 110b coupled to the first RDL 104a of the plurality of first semiconductor devices 100a is coupled to the first carrier 120a in FIG. 1, for example. The first carrier 120a may also comprise a carrier wafer or other type of carrier.

Figure 2:
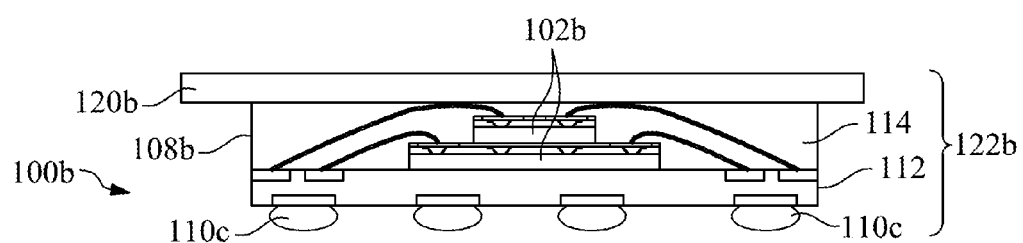

Referring next to FIG. 2, a plurality of semiconductor devices 100b is provided and are coupled to a second carrier 120b. The plurality of second semiconductor devices 100b coupled to the second carrier 120b effectively comprises a second wafer 122b because of the attachment of the second semiconductor devices 100b to the second carrier 120b, for example. The plurality of semiconductor devices 100b is also referred to herein as a plurality of second semiconductor devices 100b.

The semiconductor devices 100a are also referred to herein as second semiconductor devices 100b, and the semiconductor devices 100b are also referred to herein as first semiconductor devices 100a, e.g., in some of the claims.

In some embodiments, the plurality of second semiconductor devices 100b comprises and is referred to herein, e.g., in some of the claims, as a plurality of packaged semiconductor devices 100b. The packaged semiconductor devices 100b are fully packaged in some embodiments. In other embodiments, the packaged semiconductor devices 100b may be partially packaged. For example, the packaged semiconductor device 100b may include integrated circuit dies that have been encapsulated with protective materials, and electrical wiring structures may be coupled to the dies, to be described further herein. Further packaging will be performed on the second semiconductor devices 100b in accordance with some embodiments of the present disclosure.

In some embodiments, a plurality of the second semiconductor devices 100b is provided, and the plurality of second semiconductor devices 100b is coupled to the second carrier 120b by a method such as manually by an operator or technician, the use of an automated machine such as a pick-and-place machine, or other methods. The second semiconductor devices 100b may be adhered to the second carrier 120b using a die attached film (DAF), adhesive, or other materials (not shown). The second semiconductor devices 100b are positioned on the second carrier 120b to align with the first semiconductor devices 100a of the first wafer 122a in some embodiments, for example.

Each of the plurality of second semiconductor devices 100b may comprise a substrate 112 that includes a plurality of contact pads disposed on. The substrate 112 may include one or more interconnect structures (not shown) formed thereon that provide horizontal connections for the plurality of second semiconductor devices 100b in some embodiments. The substrate 112 may also include a plurality of through-vias (also not shown) formed therein. One or more integrated circuit dies 102b may be coupled to a top surface of the substrate 112. Each of the plurality of second semiconductor devices 100b comprises two vertically stacked integrated circuit dies 102b in the embodiment shown in FIG. 2, for example. Two or more integrated circuit dies 102b may also be packaged together horizontally in the second semiconductor devices in some embodiments, not shown.

In the embodiments shown, the integrated circuit dies 102b are coupled to contact pads on a top surface of the substrate 112 by bond wires 114. The bond wires 114 and the through-vias provide vertical electrical connections for the plurality of second semiconductor devices 100b in some embodiments, for example. A molding material 108b is disposed over the integrated circuit dies 102b, the bond wires 114, and the substrate 112. The molding material 108b may comprise similar materials as described for the molding material 108a of the plurality of first semiconductor devices 100a, for example.

In some embodiments, the integrated circuit die 102b or dies 102b comprise dynamic random access memory (DRAM) devices, for example. The integrated circuit dies 102b may also comprise other types of devices. One or more integrated circuit dies 102b may be included in the second semiconductor device 100b. The integrated circuit dies 102b may be packaged together vertically as shown, or horizontally. The integrated circuit dies 102b may be packaged in a wire bond type of package as shown in FIG. 2, or the integrated circuit dies 102b may be packaged in other types of packages.

A plurality of connectors 110c comprising a eutectic material is coupled to the bottom surface of the substrates 112 of the second semiconductor devices 100b. The plurality of connectors 110c may be coupled to contact pads on a bottom surface of the substrate 112, for example. In some embodiments, the plurality of second semiconductor devices 100b does not include the plurality of connectors 110c, e.g., in embodiments wherein the plurality of first semiconductor devices 100a includes the plurality of connectors 110a disposed on the top surface thereof (see FIG. 1). In other embodiments, both the plurality of connectors 110a and the plurality of connectors 110c are included on the first semiconductor devices 100a and the second semiconductor devices 100b, respectively. However, in the present disclosure, only the connectors 110c on the substrate 112 of the plurality of second semiconductor devices 100b are shown in the drawings.

In some embodiments, the second carrier 120b comprises a carrier wafer. The second carrier 120b may also comprise a carrier tape or other type of carrier, in other embodiments. The top surfaces of the plurality of second semiconductor devices 100b are coupled to the second carrier 120b. The molding material 108b of the plurality of second semiconductor devices 100b is coupled to the second carrier 120b in FIG. 2, for example.

The effective second wafer 122b (e.g., the second semiconductor devices 100b coupled to the second carrier 120b) is then coupled to the first wafer 122a (e.g., to the first semiconductor devices 100a on the first wafer 122a) using the plurality of connectors 110c (and/or 110a; see FIG. 1), as shown in FIG. 3 through 6. A eutectic material of the connectors 100c (and/or 110a) is then reflowed, which mechanically and electrically couples the second semiconductor devices 100b to the first semiconductor devices 100a. Each of the plurality of second semiconductor devices 100b is coupled to one of the plurality of first semiconductor devices 100a using some of the plurality of connectors 110c, for example. Because the plurality of second semiconductor devices 100b is advantageously effectively in a wafer form (e.g., by being coupled to the second carrier 120b), improved alignment of the plurality of second semiconductor devices 100b with the plurality of first semiconductor devices 100a (which are unsingulated and are also in wafer form), is achieved.

Figure 3:
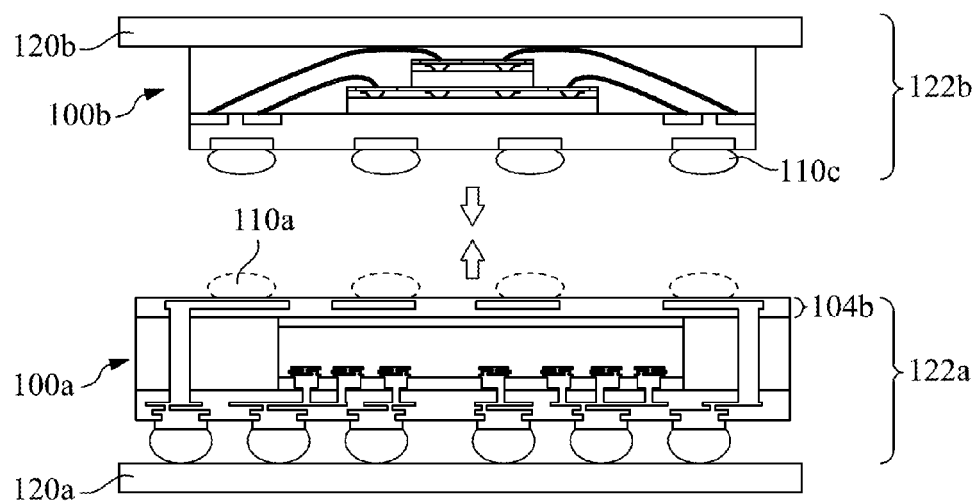

Note that all of the elements of the plurality of first semiconductor devices 100a and the plurality of second semiconductor devices 100b are not labeled in FIG. 3 and some of the subsequent figures of the present disclosure, in order to simplify the drawings: FIGS. 1 and 2 can be referred to again for more detailed element numbers. Furthermore, FIGS. 12 and 17 include a majority of the element numbers shown in FIGS. 1 and 2, and also include some additional labeled elements that will be explained further herein.

FIG. 4 is a perspective view illustrating a method of coupling the effective second wafer 122b to the first wafer 122a in accordance with some embodiments. Alignment marks 116b of the effective second wafer 122b are aligned with alignment marks 116a of the first wafer 122a during the coupling together of the effective second wafer 122b with the first wafer 122a in some embodiments. The effective second wafer 122b coupled to the first wafer 122a is shown in FIG. 5 in a perspective view.

FIGS. 4 and 5 illustrate that the plurality of first semiconductor devices 100a of the first wafer 122a and the plurality of second semiconductor devices 100b of the effective second wafer 122b are arranged in an array of rows and columns. A plurality of scribe lines 124a and 124b resides between adjacent second semiconductor devices 100b, as shown in FIG. 5. Scribe lines 124a are disposed in a y direction, and scribe lines 124b are disposed in an x direction that is substantially perpendicular to the y direction. Only one scribe line 124b in the x direction is shown for simplicity in FIG. 5; however, a scribe line 124b resides between each of the adjacent second semiconductor devices 100b. The scribe lines 124a and 124b are referred to collectively herein as scribe lines 124. Although not visible in the view shown in FIG. 5, the first wafer 122a also includes a plurality of scribe lines 124 disposed between adjacent first semiconductor devices 100a in the x and y direction. The scribe lines 124 of the first semiconductor devices 100a and the scribe lines 124 of the second semiconductor devices 100b are substantially aligned in some embodiments, for example.

Figure 7:
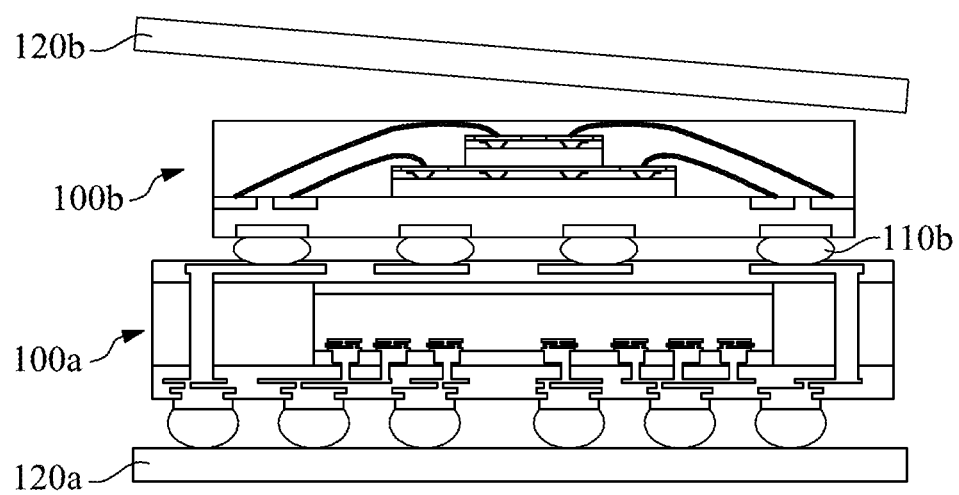

Next, in some embodiments, the second carrier 120b is removed as shown in FIG. 7 in a cross-sectional view, and the plurality of first semiconductor devices 100a and the plurality of second semiconductor devices 100b that are coupled together are singulated to form a plurality of packaged semiconductor devices 140, as shown in FIGS. 8 through 13. In other embodiments, the first carrier 120a is removed, and the plurality of first semiconductor devices 100a and the plurality of second semiconductor devices 100b that are coupled together are singulated to form a plurality of packaged semiconductor devices 140, as shown in FIGS. 14 through 18.

A method of packaging semiconductor devices in accordance with some embodiments will next be described with reference to FIGS. 8 through 13. After the effective second wafer 122b including the plurality of second semiconductor devices 100b coupled to the second carrier 120b is coupled to the first wafer 122a coupled to the first carrier 120a as shown in FIG. 8, the second carrier 120b is removed (see FIGS. 7 and 9). The coupled plurality of second semiconductor devices 100b and plurality of first semiconductor devices 100a (e.g., the coupled-together plurality of second semiconductor devices 100b and plurality of first semiconductor devices 100a) are partially singulated along the scribe lines 124 disposed between adjacent ones of the plurality of second semiconductor devices 100b and adjacent ones of the plurality of first semiconductor devices 100a, as shown in FIG. 9. The coupled plurality of second semiconductor devices 100b and plurality of first semiconductor devices 100a are partially singulated using a saw 127. The saw 127 may comprise a diamond blade or other materials in some embodiments, for example. The saw 127 includes a saw blade 126 having a first width comprising dimension $w_1$, wherein dimension $w_1$ comprises about 120 µm to about 300 µm in some embodiments. Dimension $w_1$ comprises about 120 µm to about 180 µm, about 180 µm to about 220 µm, and/or about 220 µm to about 300 µm in some embodiments, for example. Dimension $w_1$ may also comprise other values. The saw blade 126 is also referred to herein, e.g., in some of the claims, as a first saw blade 126.

The second semiconductor devices 100b are already spaced apart at the scribe lines 124. The second semiconductor devices 100b were spaced apart at the scribe lines 124 when they were attached to the second carrier 120b, as shown in FIG. 2, for example. The first wafer 122a that includes the plurality of first semiconductor devices 100b is partially singulated by the saw 127, resulting in the plurality of first semiconductor devices 100a being partially singulated, as illustrated in FIG. 9. In accordance with some embodiments, the saw 127 forms recesses 128 in the first wafer 122a between each of the plurality of first semiconductor devices 100a.

Next, an underfill material 130 is disposed between the coupled plurality of second semiconductor devices 100b and plurality of first semiconductor devices 100a and along the scribe lines 124, as shown in FIG. 10. The underfill material 130 comprises similar materials as described for the molding material 108a of the plurality of first semiconductor devices 100a in some embodiments. In some embodiments, the underfill material 130 comprises benzoic alcohol, epoxy resin, silica, and/or other materials, as examples. The underfill material 130 is applied to the tops and/or sides of the coupled plurality of second semiconductor devices 100b and plurality of first semiconductor devices 100a.

The underfill material 130 is applied using an underfill material 130 dispensing tool or system in some embodiments. The underfill material 130 can be applied using auger technology and a dispensing valve, as examples. Applying the underfill material 130 in some embodiments comprises steps such as preheating the first and second semiconductor devices 100a and 100b to a predetermined temperature, visually aligning to the first and second semiconductor devices 100a and 100b, locating a surface of the first and second semiconductor devices 100a and 100b upon which to dispense the underfill material 130, dispensing a fill pass which may comprise a single pass or multiple passes, dispensing one or more fillet passes, and/or post-heating the first and second semiconductor devices 100a and 100b, as examples. Other tools, methods, and/or steps may also be used to form the underfill material 130.

In some embodiments, the underfill material 130 is a liquid when applied so that it flows between and around the plurality of connectors 110c between the plurality of second semiconductor devices 100b and the plurality of first semiconductor devices 100a. The underfill material 130 is then cured or allowed to dry so that it forms a solid. Due to a meniscus effect, the underfill material 130 may retract away from the top surfaces of the plurality of second semiconductor devices 100b during the curing or drying process, as shown in FIG. 10. In other embodiments, the underfill material 130 does not retract and substantially reaches the top surfaces of the second semiconductor devices 100b, as shown in FIG. 15.

Referring next to FIG. 11, the coupled plurality of second semiconductor devices 100b and plurality of first semiconductor devices 100a are then fully singulating along the scribe lines 124 to form a plurality of packaged semiconductor devices 140. The singulation is performed with a saw 127' comprising a similar saw as saw 127 shown in FIG. 9. However, in some embodiments, the saw 127' comprises a saw blade 126' having a smaller width than the saw blade 126 of saw 127 so that a predetermined amount of the underfill material 130 is left remaining on sidewalls of the plurality of second semiconductor devices 100b and an upper portion of sidewalls of the plurality of first semiconductor devices 100a. The saw blade 126' of saw 127' comprises a second width comprising dimension $w_2$, wherein dimension $w_2$ comprises about 80 µm to about 260 µm in some embodiments. Dimension $w_2$ comprises about 80 µm to about 120 µm, about 120 µm to about 200 µm, and/or about 200 µm to about 280 µm in some embodiments, for example. Dimension $w_2$ may also comprise other values. The saw blade 126' is also referred to herein, e.g., in some of the claims, as a second saw blade 126'. The second width $w_2$ of the second saw blade 126' is less than the first width $w_1$ of the first saw blade 126 in some embodiments, for example.

Figure 12:
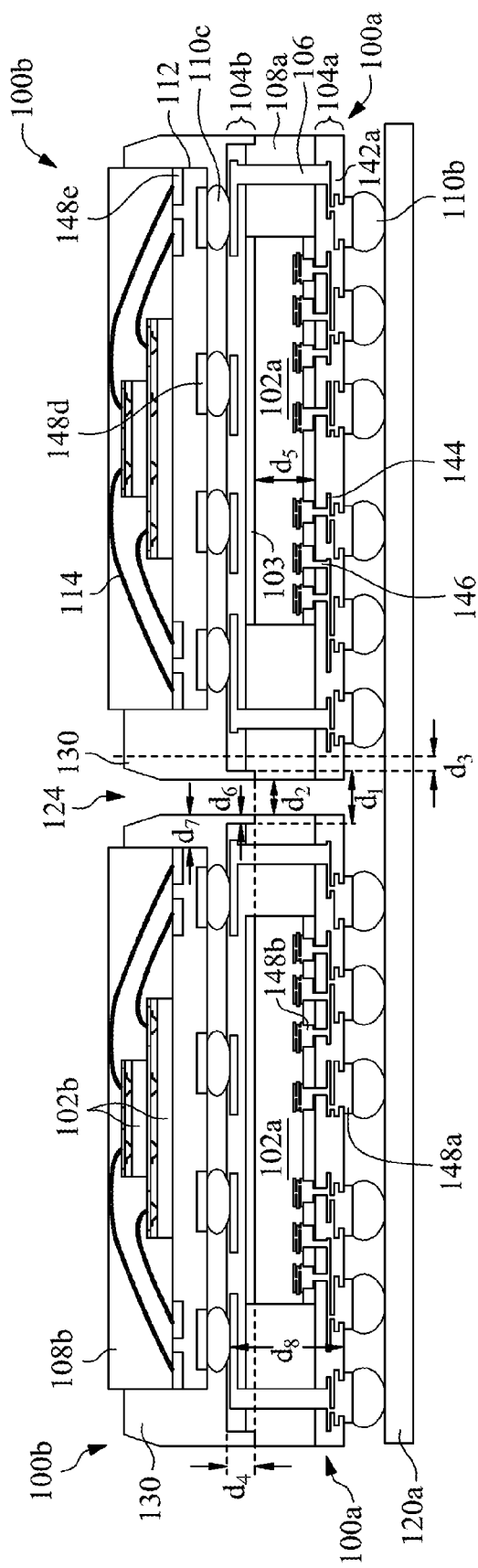

FIG. 12 is a cross-sectional view of the packaged semiconductor devices 140 shown in FIG. 11 that illustrates some dimensions and relative dimensions of the plurality of packaged semiconductor devices 140 disposed on the first carrier 120a after the full singulation process. The partial singulation width after the partial singulation step shown in FIG. 9 comprises a dimension $d_1$, wherein dimension $d_1$ comprises about 160 µm to about 340 µm in some embodiments. Dimension $d_1$ comprises about 160 µm to about 220 µm, about 220 µm to about 280 µm, and/or about 280 µm to about 340 µm in some embodiments, for example. Dimension $d_1$ is substantially the same as or slightly larger than dimension $w_1$, the first width of the first saw blade 126 used for the partial singulation in some embodiments, for example. The final singulation width after the full singulation step shown in FIG. 7 comprises a dimension $d_2$, wherein dimension $d_2$ comprises about 120 µm to about 300 µm in some embodiments. Dimension $d_2$ comprises about 120 µm to about 180 µm, about 180 µm to about 240 µm, and/or about 240 µm to about 300 µm in some embodiments, for example. Dimension $d_2$ is substantially the same as or slightly larger than dimension $w_2$, the second width of the second saw blade 126' used for the full singulation in some embodiments, for example. In some embodiments, dimension $d_1$ comprises dimension $d_2+2*(20 \mu m)$. Dimension $d_1$ is greater than dimension $d_2$ by about 20 µm on each side in some embodiments, for example. Dimensions $d_1$ and $d_2$ may also comprise other values and other relative values.

The distance between an edge of the partial singulation cut to an edge of the first semiconductor device 100a comprises a dimension $d_3$, wherein dimension $d_3$ comprises about 20 µm to about 50 µm in some embodiments. Dimension $d_3$ comprises about 20 µm to about 30 µm, about 30 µm to about 40 µm, and/or about 40 µm to about 50 µm in some embodiments, for example. The second semiconductor device 100b is fully singulated (e.g., the underfill material 130 between the second semiconductor devices 100b is fully singulated along the scribe lines 124), and the first semiconductor device 100a is partially singulated by an amount comprising a dimension $d_4$, wherein dimension $d_4$ comprises about 25 µm to about 60 µm in some embodiments. Dimension $d_4$ comprises about 25 µm to about 40 µm, about 40 µm to about 50 µm, and/or about 50 µm to about 60 µm in some embodiments, for example. A thickness of the first integrated circuit dies 102a comprises a dimension $d_5$, wherein dimension $d_5$ comprises about 100 µm to about 200 µm in some embodiments. Dimension $d_5$ comprises about 100 µm to about 130 µm, about 130 µm to about 165 µm, and/or about 165 µm to about 200 µm in some embodiments, for example. The die attach film 103 comprises a thickness of about 10 µm to about 20 µm. Dimension $d_4$ comprises about ¼ $*(d_5+$the thickness of the die attach film 103) in some embodiments, for example. Dimension $d_4$ also comprises a length (e.g., in a vertical direction in FIG. 12) of the sidewalls of the first semiconductor devices 100a that is covered by the underfill material 130. A thickness of the underfill material 130 disposed on the sidewalls of the first semiconductor devices 100a comprises a dimension $d_6$, wherein dimension $d_6$ comprises a thickness of about 5 µm to about 20 µm in some embodiments. Dimension $d_6$ comprises about 5 µm to about 10 µm, about 10 µm to about 15 µm, and/or about 15 µm to about 20 µm, for example. A thickness of the underfill material 130 disposed on the sidewalls of the second semiconductor devices 100b comprises a dimension $d_7$, wherein dimension $d_7$ comprises a thickness of about 5 µm to about 100 µm in some embodiments. Dimension $d_7$ comprises about 5 µm to about 35 µm, about 35 µm to about 90 µm, and/or about 90 µm to about 100 µm, for example. These values for dimensions $d_6$ and $d_7$ of the underfill material 130 are sufficient to provide adequate protection for the packaged semiconductor devices 140 during the full singulation process, for example. In embodiments wherein the second semiconductor devices 100b comprise a smaller width than the first semiconductor devices 100a, dimension $d_7$ is greater than dimension $d_6$. The first semiconductor devices 100a comprise a thickness comprising dimension $d_8$. In some embodiments, dimension $d_4$ is about 50% or greater than dimension $d_8$, for example. In other words, the underfill material 130 is disposed on sidewalls of the first semiconductor devices 100a by about 50% or greater of a thickness comprising dimension $d_8$ of the first semiconductor devices 100a, in some embodiments. This amount of underfill material 130 is sufficient to provide adequate protection for the packaged semiconductor devices 140 during the full singulation process, for example. Dimensions $d_3$, $d_4$, $d_5$, $d_6$, $d_7$, and $d_8$ may also comprise other values and other relative values.

FIG. 12 also illustrates some additional elements of the plurality of first semiconductor devices 100a and the plurality of second semiconductor devices 100b. The first RDL 104a of the first semiconductor devices 100a comprises a plurality of insulating material layers 142a and a plurality of conductive features 144, 146, and 148a formed within or on the plurality of insulating material layers 142a. The insulating material layers 142a may comprise silicon dioxide, low dielectric constant (k) materials having a k value less than silicon dioxide, passivation materials, other insulating materials, or multiple layers or combinations thereof, as examples. The conductive features 144, 146, and 148a of the first RDL 104a may comprise conductive lines 144, conductive vias 146, and/or contact pads 148a that are comprised of copper, copper alloys, or other materials, as examples. The connectors 110b are coupled to the contact pads 148a of the first RDL 104a. The first integrated circuit dies 102a include a plurality of contact pads 148b that is coupled to portions of the first RDL 104a.

The second RDL 104b of the first semiconductor devices 100a also includes a plurality of insulating material layers 142b and a plurality of contact pads 148c formed therein. The contact pads 148c may comprise an under-ball metallization (UBM) structure or other types of structures. The connectors 110c are coupled to the contact pads 148c of the second RDL 104b.

The substrate 112 of the second semiconductor devices 100b includes contact pads 148d disposed on a bottom surface thereof that are coupled to the connectors 110c. The substrate 112 also includes contact pads 148e on a top surface thereof that the bond wires 114 are coupled to.

Figure 13:
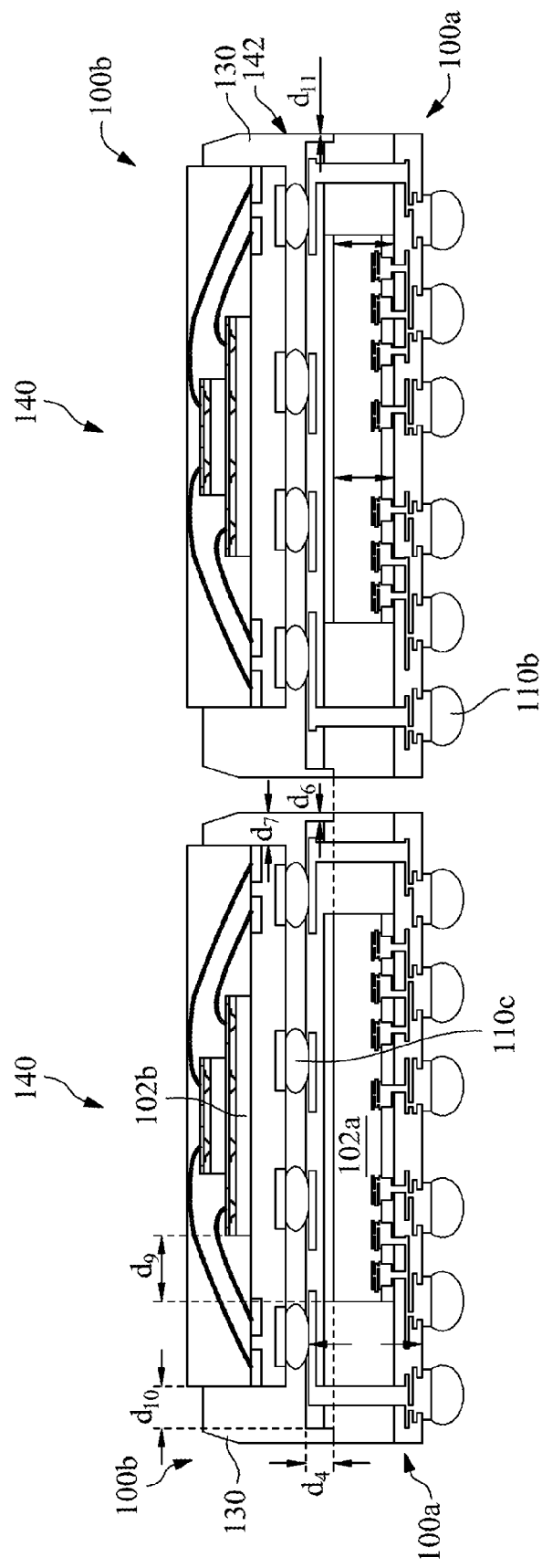

After the full singulation process shown in FIG. 11, the first carrier 120a is removed, as shown in FIG. 13. The plurality of packaged semiconductor devices 140 may then be coupled to another device or object using the plurality of connectors 110b disposed on the bottom surfaces of the packaged semiconductor devices 140, e.g., using a surface mount technology (SMT) process.

FIG. 13 also illustrates some additional dimensions of portions of the packaged semiconductor devices 140. An overlap of a second integrated circuit die 102b to a first integrated circuit die 102a comprises a dimension $d_9$, wherein dimension $d_9$ comprises about 5 μm to about 500 μm in some embodiments. Dimension $d_9$ comprises about 5 μm to about 20 μm, about 20 μm to about 100 μm, and/or about 100 μm to about 500 μm in some embodiments, for example. An overlap of a largest one of the second integrated circuit dies 102b to the first integrated circuit die 102a comprises dimension $d_9$ in the embodiments shown, for example. In embodiments wherein the second integrated circuit dies 102b comprise DRAM devices, dimension $d_9$ comprises the overlap of the first integrated circuit die 102a and the DRAM device 102b. The overlap comprising dimension $d_9$ comprises a distance from an edge of the first integrated circuit die 102a to an edge of the DRAM device 102b, for example. Dimension $d_9$ may also comprise other dimensions.

Likewise, an overlap of a first semiconductor device 100a to a second semiconductor device 100b may comprise a dimension $d_{10}$, wherein dimension $d_{10}$ comprises about 5 μm to about 500 μm in some embodiments. Dimension $d_{10}$ comprises about 5 μm to about 10 μm, about 10 μm to about 20 μm, about 20 μm to about 450 μm, and/or about 450 μm to about 500 μm in some embodiments, for example. Dimension $d_{10}$ shown in FIG. 13 may also comprise other dimensions. The overlap between the semiconductor devices 100a and 100b comprising dimension $d_{10}$ results from the semiconductor devices 100a and 100b comprising different widths, for example.

In some embodiments, grooves 142 are formed in sidewalls of the underfill material 130 during the full singulation process. The grooves 142 are formed by the saw blade 126' of the saw 127' during the full singulation process shown in FIG. 11, for example. The grooves 142 comprise a roughness formed on the surface of the sidewalls of the underfill material 130. The grooves 142 may extend along the length of the sidewalls and may comprise a depth within the sidewalls of the underfill material 130 (e.g., in a horizontal direction in the view shown in FIG. 13) by an amount comprising dimension $d_{11}$. Dimension $d_{11}$ is substantially the same as dimension $d_6$ in some embodiments. For example, the grooves 142 have a depth of dimension $d_{11}$ within substantially an entire thickness comprising dimension $d_6$ of the underfill material 130 on sidewalls of an upper portion of the first semiconductor devices 100a in some of the embodiments shown in FIG. 13. In other embodiments, dimension $d_{11}$ may be less than dimension $d_6$ of the thickness of the underfill material 130 on the sidewalls of the upper portion of the first semiconductor devices 100a. Dimension $d_{11}$ may also comprise other values and other relative values.

In the embodiments shown in FIGS. 8 through 13, the underfill material 130 is formed on sidewalls of the first semiconductor devices 100a and on sidewalls of an upper portion of the second semiconductor devices 100b.

In other embodiments, the underfill material 130 may be completely formed on sidewalls of both the first semiconductor devices 100a and the second semiconductor devices 100b, as shown in FIGS. 14 through 18, which illustrate cross-sectional views of a method of packaging semiconductor devices at various stages in accordance with some embodiments of the present disclosure. Beginning with the packaging process stage shown in FIG. 8, the first carrier 120a is removed, and the second carrier 120b coupled to the plurality of second semiconductor devices 100b is inverted, as shown in FIG. 14.

After the first carrier 120a is removed, the coupled plurality of second semiconductor devices 100b and plurality of first semiconductor devices 100a are partially singulated along the scribe lines 124 disposed between adjacent ones of the plurality of second semiconductor devices 100b and adjacent ones of the plurality of first semiconductor devices 100a, as shown in FIG. 14. The coupled plurality of second semiconductor devices 100b and plurality of first semiconductor devices 100a are partially singulated using a saw 127 comprising a first saw blade 126 having a width comprising dimension $w_1$.

The first wafer 122a that includes the plurality of first semiconductor devices 100b is fully singulated by the saw 127. In accordance with some embodiments, the first saw blade 126 reaches the spaces between the first wafer 122a and the second wafer 122b so that the underfill material 130 shown in FIG. 10 can be applied around the plurality of connectors 110c. The effective second wafer 122b that includes the plurality of second semiconductor devices 100b is not singulated in some embodiments during the partial singulation process. Because the second semiconductor devices 100b are individually attached to the second carrier 120b, the second semiconductor devices 100b are already separated at the scribe lines 124, for example. In other embodiments, the second semiconductor devices 100b may be partially singulated by the saw 127, not shown. For example, if the second semiconductor devices 100b are attached to the second carrier 120b such that the spacing between adjacent second semiconductor devices 100b along the scribe lines 124 is less than the width $w_1$ of the first saw blade 126, portions of the second semiconductor devices 100b may be removed during the partial singulation process.

Figure 16:
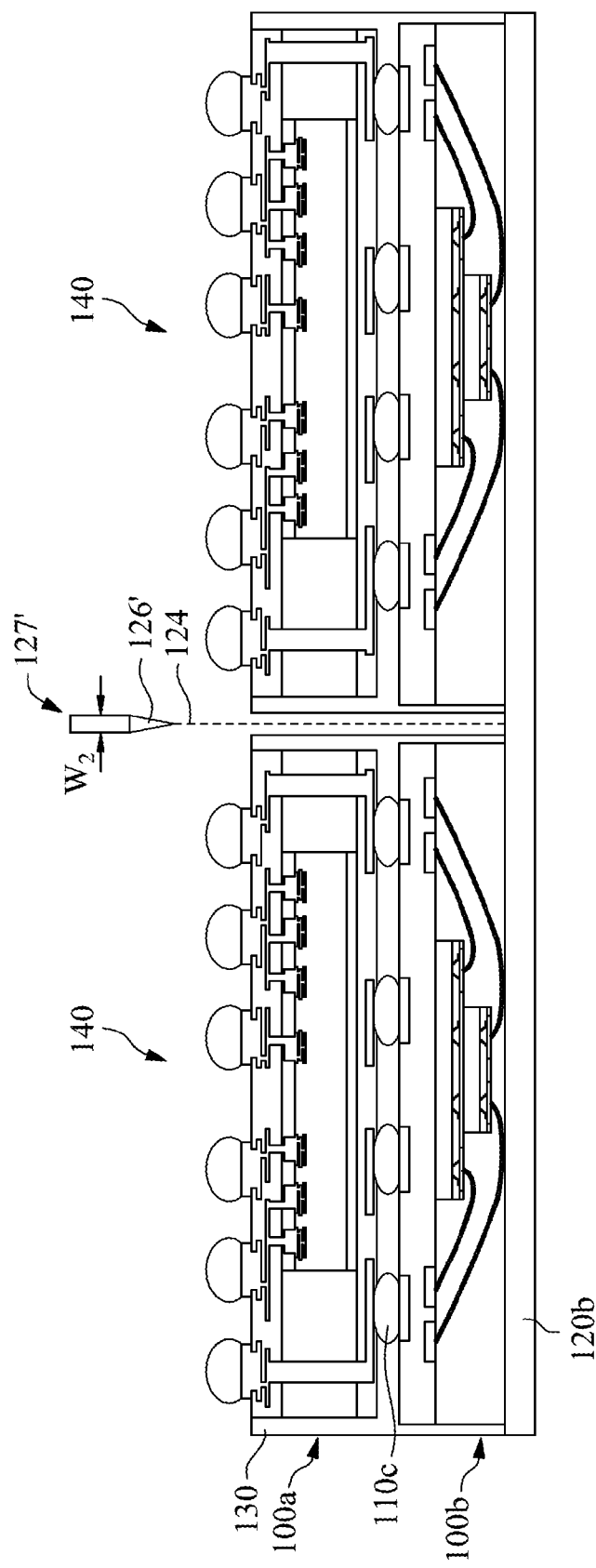

Next, an underfill material 130 is disposed between the coupled plurality of second semiconductor devices 100b and plurality of first semiconductor devices 100a and along the scribe lines 124, as shown in FIG. 15, and as described with reference to FIG. 10. The coupled plurality of second semiconductor devices 100b and plurality of first semiconductor devices 100a are then fully singulating along the scribe lines 124 to form a plurality of packaged semiconductor devices 140, as shown in FIG. 16 and as described with reference to FIG. 11. The full singulation process is performed with a saw 127' that comprises a second saw blade 126' that has a smaller second width comprising dimension $w_2$ than the first width comprising dimension $w_1$ of the first saw blade 126 of saw 127, so that a predetermined amount of underfill material 130 is left remaining on sidewalls of the plurality of first semiconductor devices 100a and on sidewalls of the plurality of second semiconductor devices 100b.

Figure 17:
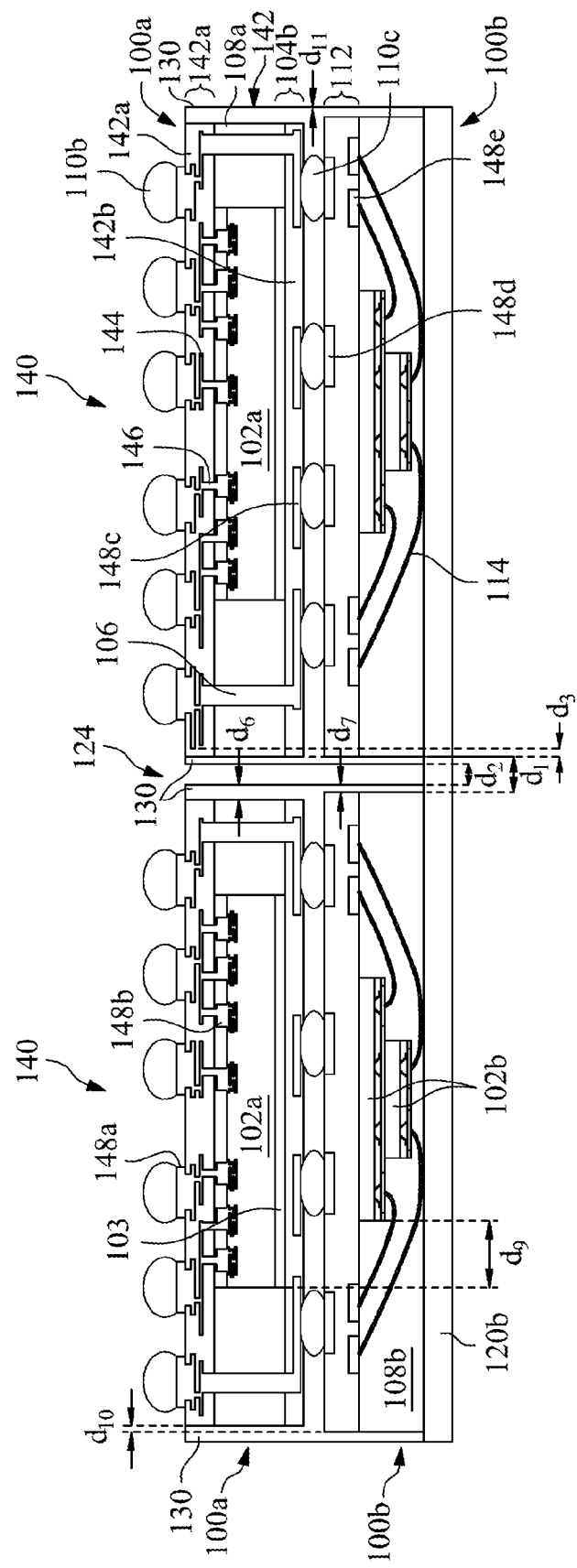

FIG. 17 is a cross-sectional view of the packaged semiconductor devices 140 shown in FIG. 16, illustrating some additional elements of the plurality of first semiconductor devices 100a and the plurality of second semiconductor devices 100b and some dimensions and relative dimensions of the packaged semiconductor devices 140 disposed on the first carrier 120a after the full singulation process, as shown and described for FIG. 12. Dimensions $d_1$, $d_2$, $d_3$, $d_9$, $d_{10}$, and $d_{11}$ comprise similar values as described for dimensions $d_1$, $d_2$, $d_3$, $d_9$, $d_{10}$, and $d_{11}$ shown in FIGS. 12 and 13 in some embodiments. However, dimension $d_7$ in FIG. 17 is less than dimension $d_7$ shown in FIGS. 12 and 13, and dimension $d_6$ in FIG. 17 is greater than dimension $d_6$ shown in FIGS. 12 and 13 in some embodiments. For example, in FIG. 17, a thickness of the underfill material 130 disposed on the sidewalls of the first semiconductor devices 100a comprises a dimension $d_6$, wherein dimension $d_6$ comprises a thickness of about 5 µm to about 100 µm in some embodiments. Dimension $d_6$ comprises about 5 µm to about 35 µm, about 35 µm to about 90 µm, and/or about 90 µm to about 100 µm in some embodiments, for example. A thickness of the underfill material 130 disposed on the sidewalls of the second semiconductor devices 100b comprises a dimension $d_7$, wherein dimension $d_7$ comprises a thickness of about 5 µm to about 20 µm in some embodiments. Dimension $d_7$ comprises about 5 µm to about 10 µm, about 10 µm to about 15 µm, and/or about 15 µm to about 20 µm, for example. These values for dimensions $d_6$ and $d_7$ of the underfill material 130 are sufficient to provide adequate protection for the packaged semiconductor devices 140 during the full singulation process, for example. In embodiments wherein the first semiconductor devices 100a comprise a smaller width than the second semiconductor devices 100b, dimension $d_7$ is less than dimension $d_6$.

In the embodiments shown in FIG. 17, an overlap of a second semiconductor device 100b to a first semiconductor device 100a that results from the semiconductor devices 100a and 100b comprising different widths may comprise a dimension $d_{10}$, wherein dimension $d_{10}$ comprises about 5 µm to about 500 µm in some embodiments. Dimension $d_{10}$ comprises about 5 µm to about 10 µm, about 10 µm to about 20 µm, about 20 µm to about 450 µm, and/or about 450 µm to about 500 µm in some embodiments, for example. Dimension $d_{10}$ shown in FIG. 17 may also comprise other values.

The molding material 130 is left remaining on sidewalls of each of the plurality of first semiconductor devices 100a and also on sidewalls of each of the second semiconductor devices 100b. Thus, the molding material 130 may be formed on substantially the entire length of the sidewalls of both the first semiconductor devices 100a and the second semiconductor devices 100b in some embodiments, for example, as shown in FIG. 17.

Figure 18:
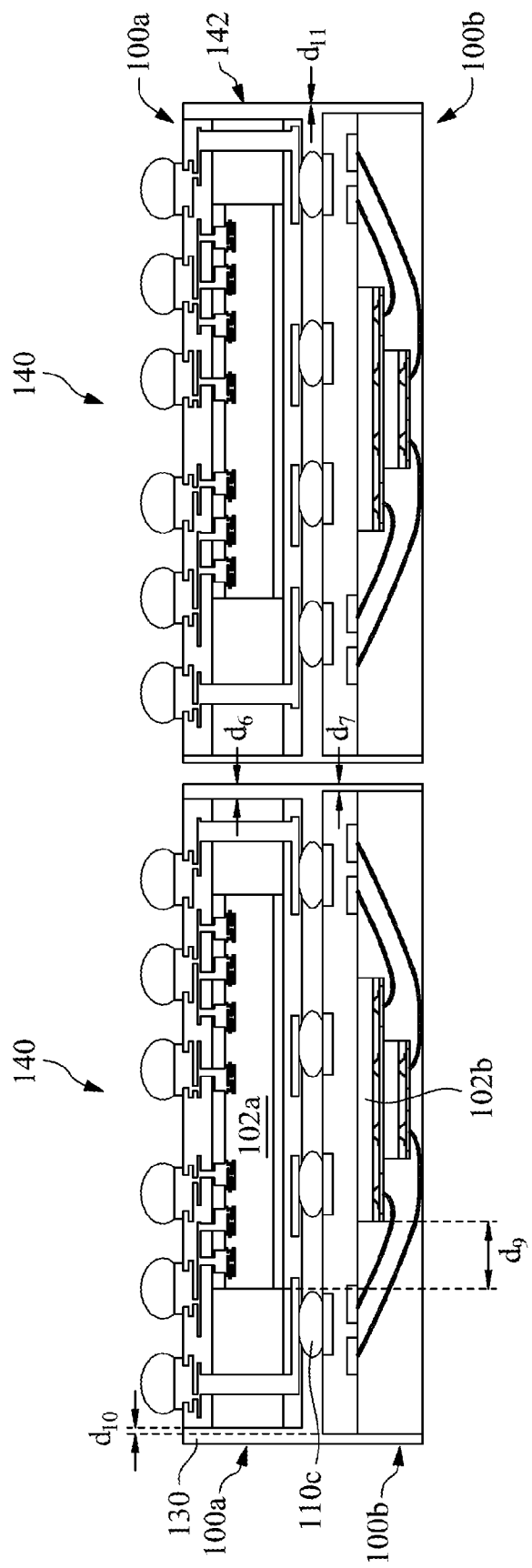

After the full singulation process, the second carrier 120b is removed, as shown in FIG. 18. The plurality of packaged semiconductor devices 140 may then be coupled to another device or object using the connectors 110b, e.g., using a SMT process. As described for FIG. 13, the integrated circuit dies 102a and 102b may comprise an overlap comprising dimension $d_9$, and the semiconductor devices 100a and 100b may comprise an overlap comprising dimension $d_{10}$, within the packaged semiconductor devices 140, in some embodiments. Grooves 142 having a depth comprising dimension $d_{11}$ within the sidewalls of the underfill material are formed in the sidewalls of the underfill material 130 by the saw blade 126' during the full singulation process shown in FIG. 14. Dimension $d_{11}$ is substantially the same as dimension $d_7$ in some embodiments. For example, the grooves 142 have a depth of dimension $d_{11}$ within substantially an entire thickness comprising dimension $d_7$ of the underfill material 130 on sidewalls of the second semiconductor devices 100b in some of the embodiments shown in FIG. 17. In other embodiments, dimension $d_{11}$ may be less than dimension $d_7$ of the thickness of the underfill material 130 on the sidewalls of the second semiconductor devices 100b.

Embodiments of the present disclosure are advantageously implementable in and are particularly beneficial when used in package-on-package (PoP) devices, in some applications. The packaged semiconductor devices 140 may comprise PoP devices or system-on-a chip (SOC) devices in some embodiments, as examples.

In some embodiments, the first integrated circuit dies 102a comprise logic devices or processors and the first semiconductor devices 100a comprise fan-out wiring, and the second integrated circuit dies 102b comprise memory devices such as dynamic random access memory (DRAM) devices, e.g., in some embodiments wherein the two-step singulation and underfill material application process described herein is implemented in an integration fan-out (InFO) PoP device. In some embodiments, the second semiconductor devices 100b include a plurality of stacked integrated circuit dies 102b comprising DRAM devices, for example. The first integrated circuit dies 102a, the second integrated circuit dies 102b, the first semiconductor devices 100a, and the second semiconductor devices 100b may also comprise other types of devices, and the two-step singulation and underfill material application processes described herein may be implemented in other types of applications.

Advantages of some embodiments of the present disclosure include providing novel packaging methods for PoP devices and other types of 3DICs wherein a two-step singulation approach is implemented. The underfill material applied after the first partial singulation step advantageously results in the prevention or reduction of sidewall chipping during the full singulation process; thus, packaging yields are improved. The packaging methods described herein require fewer processing steps and result in higher accuracy. Because the second semiconductor devices are effectively in wafer form because the second semiconductor devices are attached to the second carrier when they are connected to or coupled to the first semiconductor devices that are also in wafer form, alignment is improved, which results in less chance of the dicing saw blade hitting edges of the semiconductor devices during the singulation process and causing damage. The "batch mount" (e.g., effective wafer to wafer attachment) provides improved alignment for the singulation process. The packaging processes described herein also result in a time and cost savings. The batch mount avoids the need to individually attach each one of the second semiconductor devices to the wafer containing the first semiconductor devices, for example. Furthermore, the packaging methods and structures described herein are easily implementable in packaging process flows and structures.

In some embodiments, a device includes a first semiconductor device and a second semiconductor device coupled to the first semiconductor device. An underfill material is disposed between the first semiconductor device and the second semiconductor device. The underfill material is also disposed on sidewalls of the first semiconductor device and the second semiconductor device. The underfill material comprises a first thickness on sidewalls of the first semiconductor device and a second thickness on sidewalls of the second semiconductor device. The second thickness is different than the first thickness.

In other embodiments, a device includes a fan-out structure and a packaged semiconductor device coupled to the fan-out structure by a plurality of connectors. An underfill material is disposed between the fan-out structure and the packaged semiconductor device and between the plurality of connectors. The underfill material is also disposed on sidewalls of the fan-out structure and sidewalls of the packaged semiconductor device.

In yet other embodiments, a method of packaging a semiconductor device includes providing a fan-out structure, coupling a packaged semiconductor device to the fan-out structure using a plurality of connectors, and partially singulating the coupled packaged semiconductor device and fan-out structure along scribe lines disposed proximate sidewalls of the packaged semiconductor device and sidewalls of the fan-out structure. An underfill material is disposed between the packaged semiconductor device and the fan-out structure and along the scribe lines. The method includes fully singulating the coupled packaged semiconductor device and fan-out structure along the scribe lines to form a packaged semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
providing a fan-out structure having a first plurality of electrodes;
providing a packaged semiconductor device having a second plurality of electrodes;
aligning the first and second plurality of electrodes;
coupling the packaged semiconductor device to the fan-out structure by their respective electrodes using a plurality of connectors;
partially singulating the coupled packaged semiconductor device and fan-out structure along scribe lines disposed proximate sidewalls of the packaged semiconductor device and sidewalls of the fan-out structure;
disposing an underfill material between the packaged semiconductor device and the fan-out structure and along the partially singulated scribe lines; and
fully singulating the coupled packaged semiconductor device and fan-out structure along the scribe lines to form a packaged semiconductor device.

2. The method according to claim 1, wherein fully singulating the coupled packaged semiconductor device and fan-out structure comprises leaving a portion of the underfill material on sidewalls of the fan-out structure, sidewalls of the packaged semiconductor device, or sidewalls of both the fan-out structure and the packaged semiconductor device.

3. The method according to claim 1, wherein providing the fan-out structure comprises providing a wafer comprising a plurality of fan-out structures; wherein the method further comprises coupling the wafer to a first carrier, coupling a plurality of the packaged semiconductor devices to a second carrier, and coupling each of the plurality of the packaged semiconductor devices to one of the plurality of fan-out structures on the wafer using a plurality of connectors; wherein partially singulating the coupled packaged semiconductor device and fan-out structure comprises partially singulating the coupled plurality of the packaged semiconductor devices and plurality of fan-out structure along scribe lines disposed between adjacent plurality of packaged semiconductor devices and adjacent plurality of fan-out structures; wherein disposing the underfill material between the packaged semiconductor device and the fan-out structure comprises disposing the underfill material between the coupled plurality of packaged semiconductor devices and plurality of fan-out structures along the scribe lines; and wherein fully singulating the coupled packaged semiconductor device and the fan-out structure along the scribe lines comprises fully singulating the plurality of packaged semiconductor devices and the plurality of fan-out structures along the scribe lines to form a plurality of packaged semiconductor devices.

4. The method according to claim 3, further comprising removing the second carrier, before partially singulating the coupled plurality of packaged semiconductor devices and plurality of fan-out structures; and removing the first carrier, after fully singulating the coupled plurality of packaged semiconductor device and the plurality of fan-out structures.

5. The method according to claim 4, wherein partially singulating the coupled plurality of packaged semiconductor devices and plurality of fan-out structures comprises partially singulating the plurality of fan-out structures on the wafer.

6. The method according to claim 5, wherein fully singulating the coupled plurality of packaged semiconductor devices and plurality of fan-out structures comprises leaving a portion of the underfill material on sidewalls of the plurality of packaged semiconductor devices and on an upper portion of sidewalls of the plurality of fan-out structures.

7. The method according to claim 3, further comprising removing the first carrier, before partially singulating the coupled plurality of packaged semiconductor devices and plurality of fan-out structures; and removing the second carrier, after fully singulating the coupled plurality of packaged semiconductor device and the plurality of fan-out structures.

8. The method according to claim 7, wherein partially singulating the coupled plurality of packaged semiconductor devices and plurality of fan-out structures comprises fully singulating the plurality of fan-out structures on the wafer.

9. The method according to claim 7, wherein fully singulating the coupled plurality of packaged semiconductor devices and plurality of fan-out structures comprises leaving a portion of the underfill material on sidewalls of the plurality of fan-out structures and sidewalls of the plurality of packaged semiconductor devices.

10. The method according to claim 3, wherein the first carrier or the second carrier comprises a carrier tape or a carrier wafer.

11. The method according to claim 3, wherein partially singulating the coupled plurality of packaged semiconductor devices and plurality of fan-out structures along the scribe lines comprises using a first saw blade, the first saw blade having a first width, wherein fully singulating the coupled plurality of packaged semiconductor devices and plurality of fan-out structures along the scribe lines comprises using a second saw blade, the second saw blade having a second width, and wherein the second width is less than the first width.

12. A method of packaging a semiconductor device, the method comprising:
coupling a first plurality of packaged semiconductor devices to a wafer comprising a second plurality of packaged semiconductor devices formed therein;
forming a plurality of recesses in the wafer, a respective one of the plurality of recesses disposed between adjacent ones of the second plurality of packaged semiconductor devices;
filling the plurality of recesses with a non-conductive underfill material, the underfill material laterally surrounding each of the first plurality of packaged semiconductor devices and the underfill injecting into a space between the first plurality of packaged semiconductor devices and the second plurality of packaged semiconductor devices; and singulating the wafer along the plurality of recesses to form a third plurality of packaged semiconductor devices, a respective one of the third plurality of packaged semiconductor devices comprising a respective one of the first plurality of packaged semiconductor devices and a respective one of the second plurality of packaged semiconductor devices.

13. The method of claim 12, wherein the coupling the first plurality of packaged semiconductor devices to the wafer comprises:

bonding a first surface of each of the first plurality of packaged semiconductor devices to a carrier;

coupling a second surface of each the first plurality of packaged semiconductor devices to the wafer using a plurality of electrical connectors; and after the coupling, removing the carrier from the first surface of each of the first plurality of packaged semiconductor devices.

14. The method of claim 12, wherein the forming the plurality of recesses in the wafer comprises partially singulating the wafer along scribe lines disposed proximate between adjacent ones of the second plurality of packaged semiconductor devices.

15. The method of claim 12, wherein the plurality of recesses extend through a molding compound disposed between adjacent ones of the second plurality of packaged semiconductor devices.

16. The method of claim 12, wherein the underfill material remains disposed at sidewalls of each of the third plurality of packaged semiconductor devices.

17. A method of packaging a semiconductor device, the method comprising:

bonding a first plurality of packaged semiconductor devices to a first redistribution layer (RDL) disposed over a first surface of a molding compound, the molding compound encapsulating a second plurality of packaged semiconductor devices, each of the second plurality of packaged semiconductor devices coupled to a second RDL disposed at a second surface of the molding compound opposite the first surface;

forming a plurality of recesses through the first RDL and partially through the molding compound, the plurality of recesses formed along scribe lines disposed between adjacent ones of the second plurality of packaged semiconductor devices;

disposing an underfill material in the plurality of recesses and between the first plurality of packaged semiconductor devices and the second plurality of packaged semiconductor devices; and fully singulating the underfill material, the molding compound, the first RDL, and the second RDL to form a third plurality of packaged semiconductor devices.

18. The method of claim 17, wherein after the fully singulating, the underfill material remains disposed over sidewalls of a respective one of the first plurality of packaged semiconductor devices and a respective one of the second plurality of packaged semiconductor devices.

19. The method of claim 17, wherein each of the second plurality of packaged semiconductor devices comprises a fan-out semiconductor device package.

20. The method of claim 17, wherein bonding the first plurality of packaged semiconductor devices to the first RDL comprises forming a plurality of electrical connectors over the first RDL and coupling the first plurality of packaged semiconductor devices to the plurality of electrical connectors.

* * * * *